United States Patent
Matsuhashi et al.

(10) Patent No.: US 10,685,815 B2
(45) Date of Patent: Jun. 16, 2020

(54) PLASMA PROCESSING APPARATUS AND DEVICE MANUFACTURING METHOD

(75) Inventors: Ryo Matsuhashi, Eden Prairie, MN (US); Hiroshi Akasaka, Kawasaki (JP); Yoshimitsu Kodaira, Tama (JP); Atsushi Sekiguchi, Hino (JP); Naoko Matsui, Machida (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 1424 days.

(21) Appl. No.: 13/392,126

(22) PCT Filed: Aug. 25, 2010

(86) PCT No.: PCT/JP2010/005228
§ 371 (c)(1),
(2), (4) Date: Feb. 24, 2012

(87) PCT Pub. No.: WO2011/024446
PCT Pub. Date: Mar. 3, 2011

(65) Prior Publication Data
US 2012/0145671 A1 Jun. 14, 2012

(30) Foreign Application Priority Data

Aug. 25, 2009 (JP) .................................. 2009-193867
Dec. 28, 2009 (JP) .................................. 2009-296618

(51) Int. Cl.
*H01J 37/32* (2006.01)
(52) U.S. Cl.
CPC ........ *H01J 37/3266* (2013.01); *H01J 37/321* (2013.01)
(58) Field of Classification Search
CPC ........... H01J 37/32669; H01J 37/32678; H01J 37/321–32119; H01J 37/3266; H05H 2001/4652–4667

(Continued)

(56) References Cited

U.S. PATENT DOCUMENTS 5,122,251 A * 6/1992 Campbell et al. ........ 204/298.06
5,537,004 A * 7/1996 Imahashi .............. H01J 37/321
118/620

(Continued)

FOREIGN PATENT DOCUMENTS

CN 101548364 A 9/2009
JP 6-279984 A 10/1994

(Continued)

OTHER PUBLICATIONS

Office Action in Chinese Patent Application No. 201080021815.8, dated Sep. 30, 2013, with English translation (pp. 10).

(Continued)

*Primary Examiner* — Kambiz Zand
*Assistant Examiner* — Mirza Israr Javed
(74) *Attorney, Agent, or Firm* — Venable LLP

(57) ABSTRACT

The present invention provides a plasma processing apparatus which reduces damage from plasma generated in a discharge vessel and lengthens the replacement cycle of the discharge vessel. A plasma processing apparatus 1 is provided with a processing chamber 2 partitioning a processing space, a discharge vessel 3 whose one end opens facing inside the processing chamber 2 and the other end is closed, an antenna 4 which is disposed around the discharge vessel 3 and generates an induced electric field to generate plasma in the discharge vessel 3 under reduced pressure, and an electromagnet 9 which is arranged around the discharge vessel 3 and forms a divergent magnetic field in the discharge vessel 3. The discharge vessel 3 has at its closed end portion a protrusion 15 projecting toward the processing chamber 2.

4 Claims, 8 Drawing Sheets

(58) Field of Classification Search
USPC .................. 118/723 I, 723 IR, 723 AN; 156/345.48–345.49
See application file for complete search history.

(56) References Cited

U.S. PATENT DOCUMENTS

| | | | | |
|---|---|---|---|---|
| 5,556,521 | A * | 9/1996 | Ghanbari | H01J 37/321 118/723 I |
| 5,569,363 | A * | 10/1996 | Bayer | H01J 37/321 204/192.1 |
| 5,690,781 | A * | 11/1997 | Yoshida | H01J 37/32458 156/345.48 |
| 5,810,932 | A * | 9/1998 | Ueda | H01J 37/32082 118/723 AN |
| 5,824,602 | A * | 10/1998 | Molvik | H01J 37/321 438/714 |
| 5,863,376 | A * | 1/1999 | Wicker | C23C 16/45565 156/345.38 |
| 5,897,713 | A * | 4/1999 | Tomioka | C23C 16/401 118/723 I |
| 6,096,232 | A * | 8/2000 | Hashimoto | H01J 37/32935 216/60 |
| 6,189,484 | B1 * | 2/2001 | Yin | H01J 37/321 118/723 I |
| 7,183,716 | B2 * | 2/2007 | Kanarov | H01J 27/18 118/723 I |
| RE40,951 | E | 11/2009 | Kodaira et al. | |
| 8,343,308 | B2 | 1/2013 | Tian et al. | |
| 2003/0015293 | A1 * | 1/2003 | Obuchi | H01J 37/32082 156/345.48 |
| 2003/0111963 | A1 * | 6/2003 | Tolmachev | H01J 37/321 315/111.51 |
| 2004/0048461 | A1 * | 3/2004 | Chen | C23C 14/022 438/629 |
| 2007/0227666 | A1 * | 10/2007 | Matsumoto | C23C 16/45565 156/345.47 |
| 2009/0250334 | A1 * | 10/2009 | Qiu | H01J 37/321 204/164 |
| 2010/0032094 | A1 | 2/2010 | Tian et al. | |
| 2010/0301008 | A1 | 12/2010 | Shinde et al. | |
| 2011/0256642 | A1 | 10/2011 | Matsui et al. | |
| 2013/0115780 | A1 * | 5/2013 | Okumura | H05H 1/30 438/710 |

FOREIGN PATENT DOCUMENTS

| | | |
|---|---|---|
| JP | 10-189549 A | 7/1998 |
| JP | 2000-133498 A | 5/2000 |
| JP | 2003-347282 A | 12/2003 |

OTHER PUBLICATIONS

Decision of Refusal dated Mar. 14, 2014, in corresponding JP Patent Application No. 2013-137798 (8 pages).

* cited by examiner

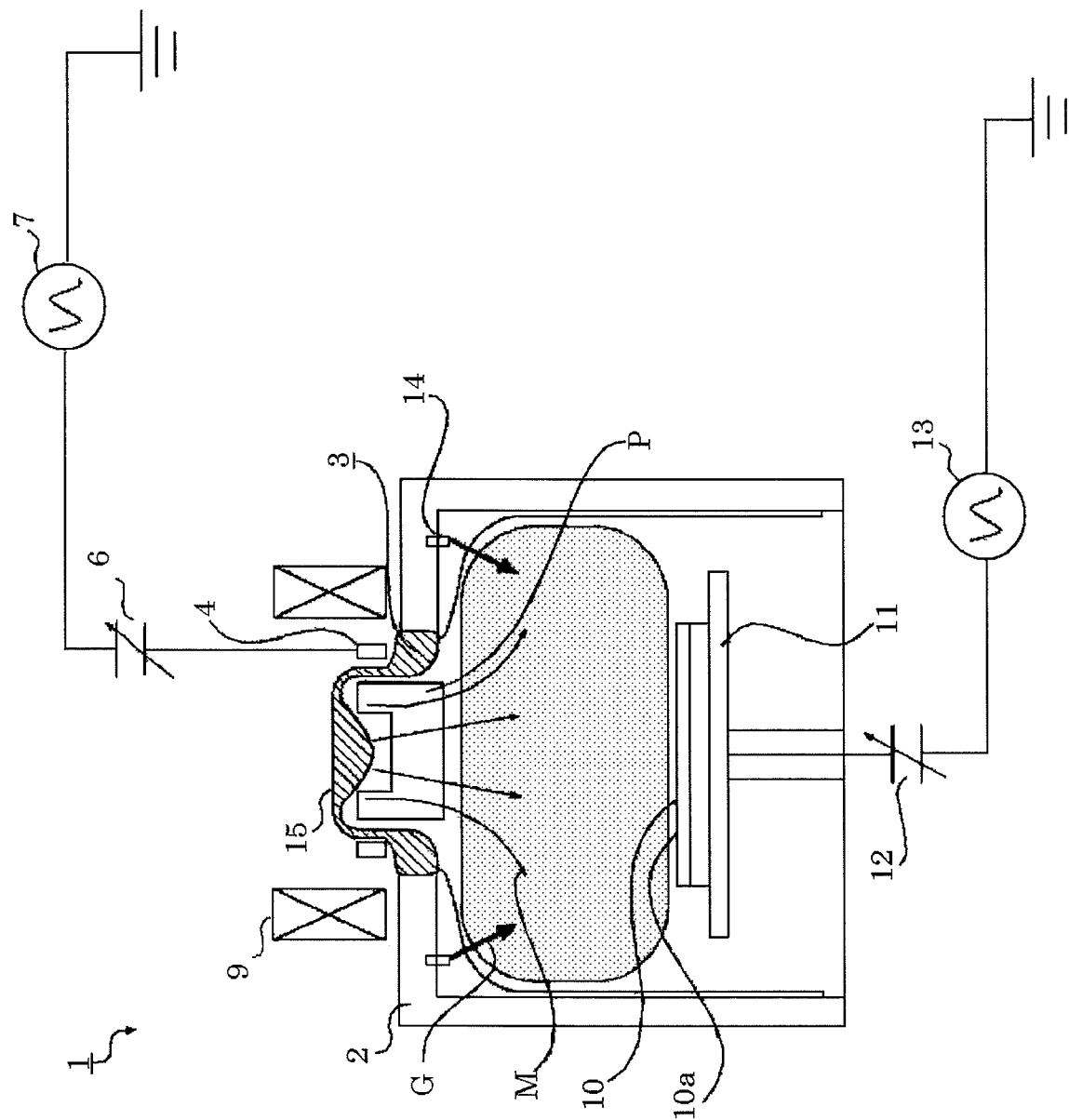
[Fig. 1]

[Fig. 2]
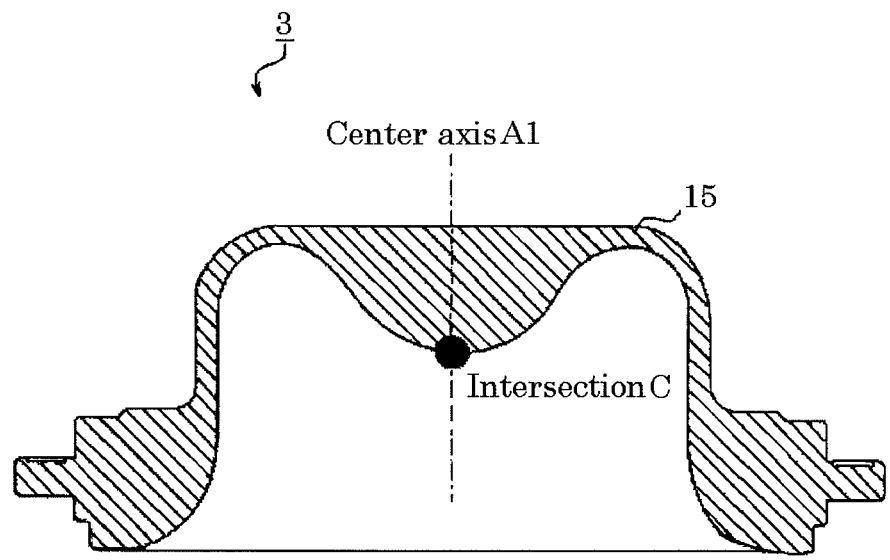
[Fig. 3]
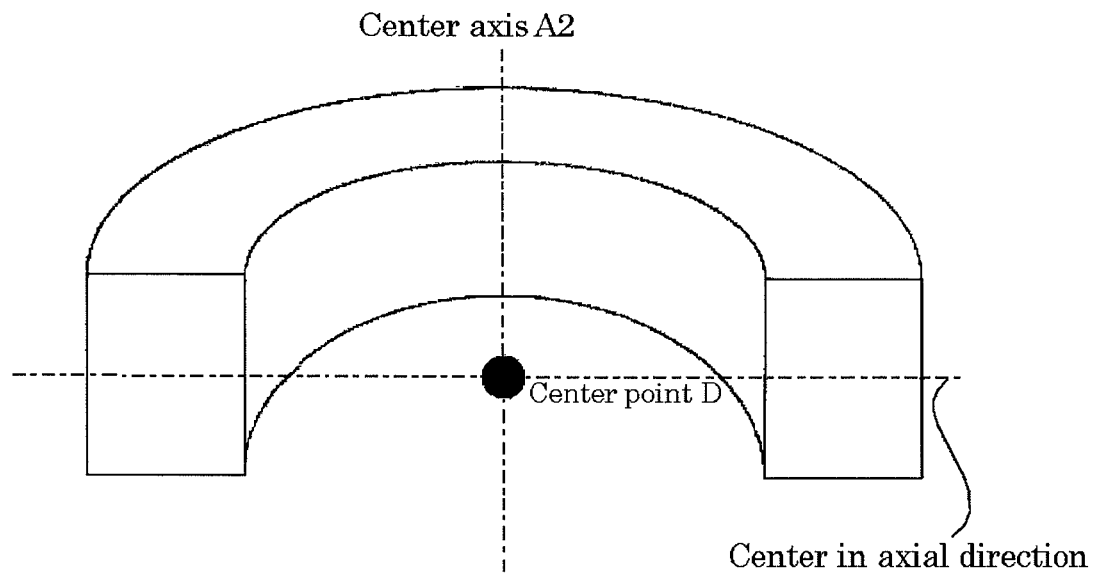

[Fig. 4]
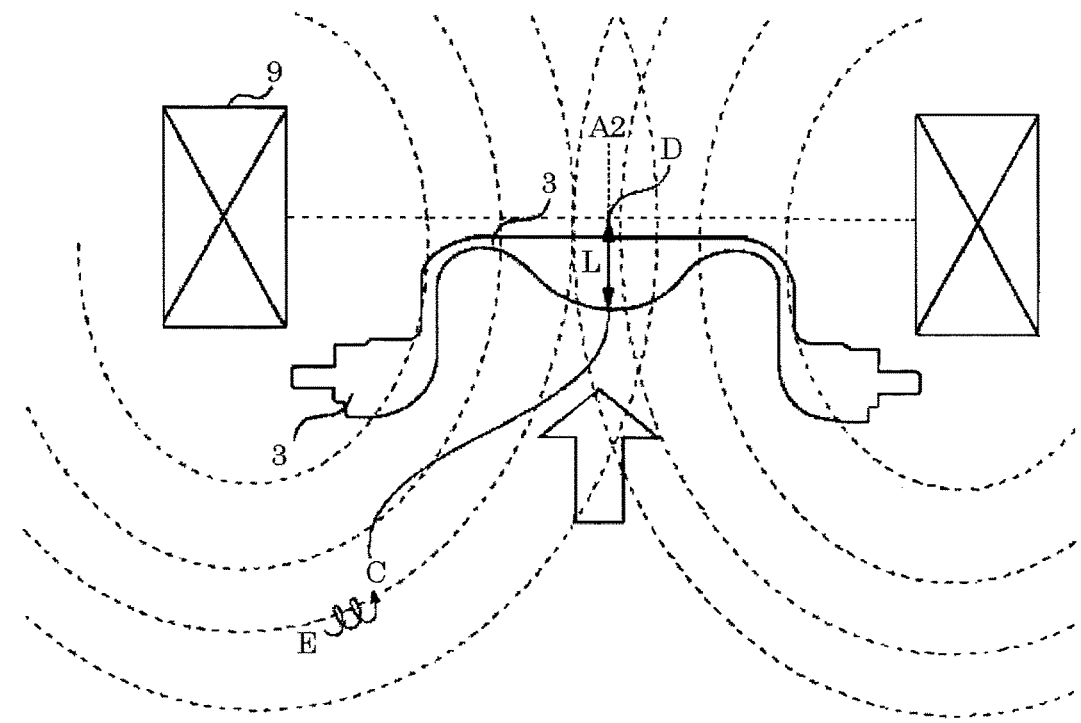
[Fig. 5]
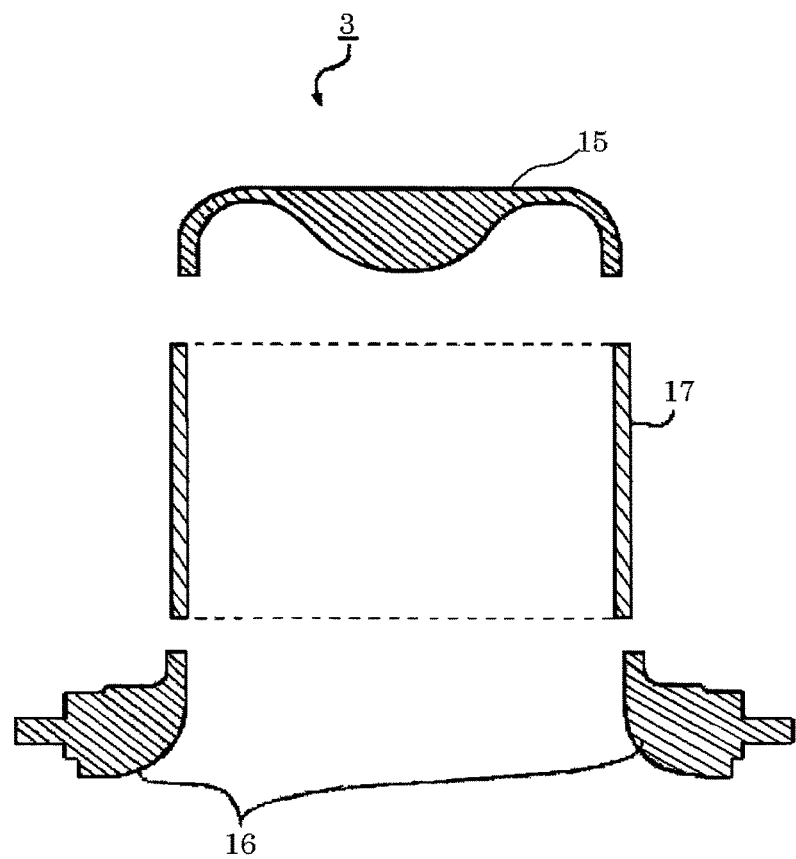

[Fig. 6]
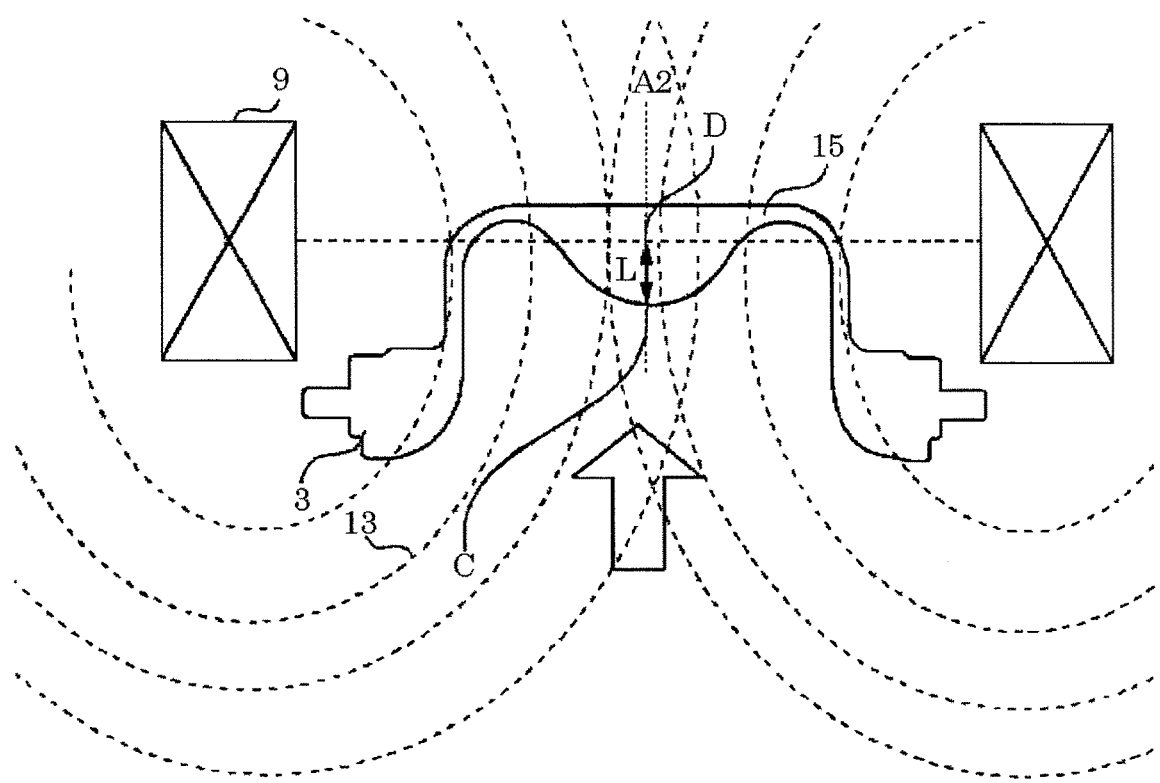

[Fig. 7]
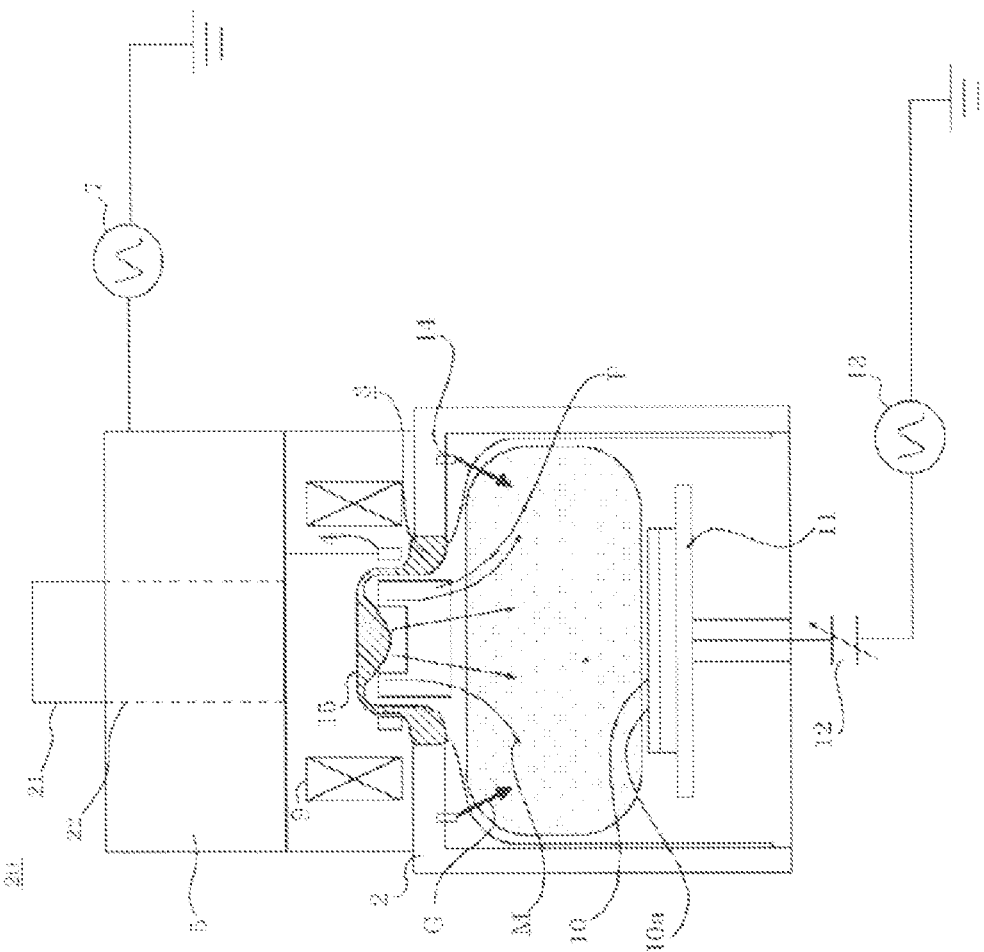
[Fig. 8]
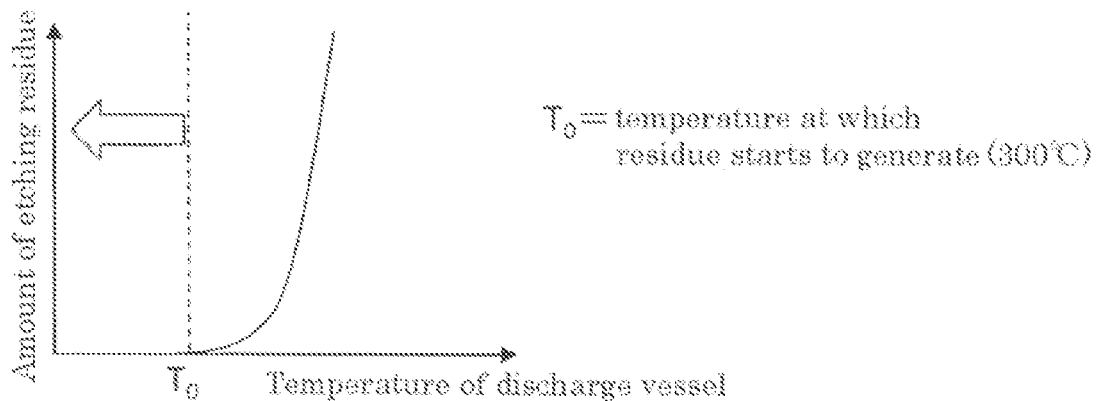
$T_0$ = temperature at which residue starts to generate (300°C)

[Fig. 9]
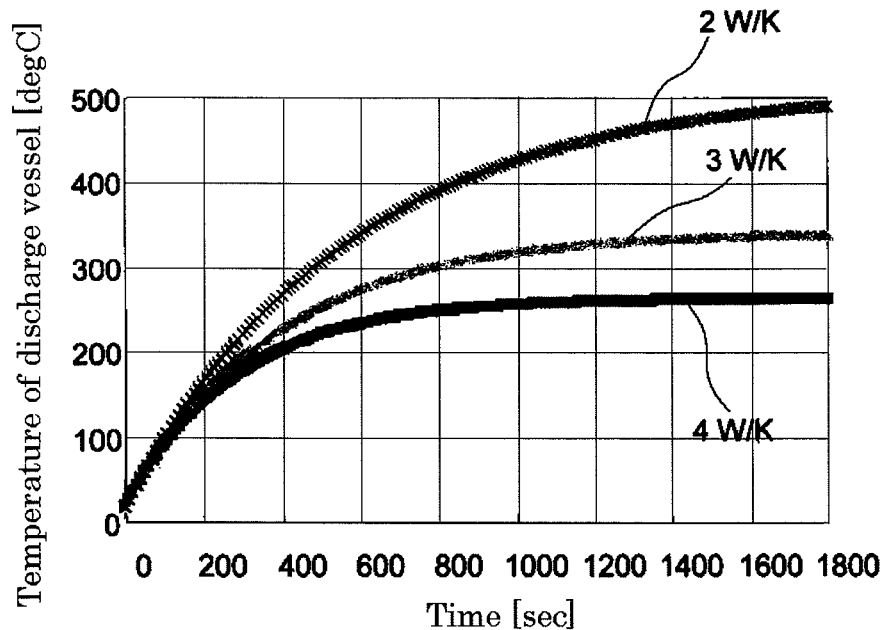
[Fig. 10]
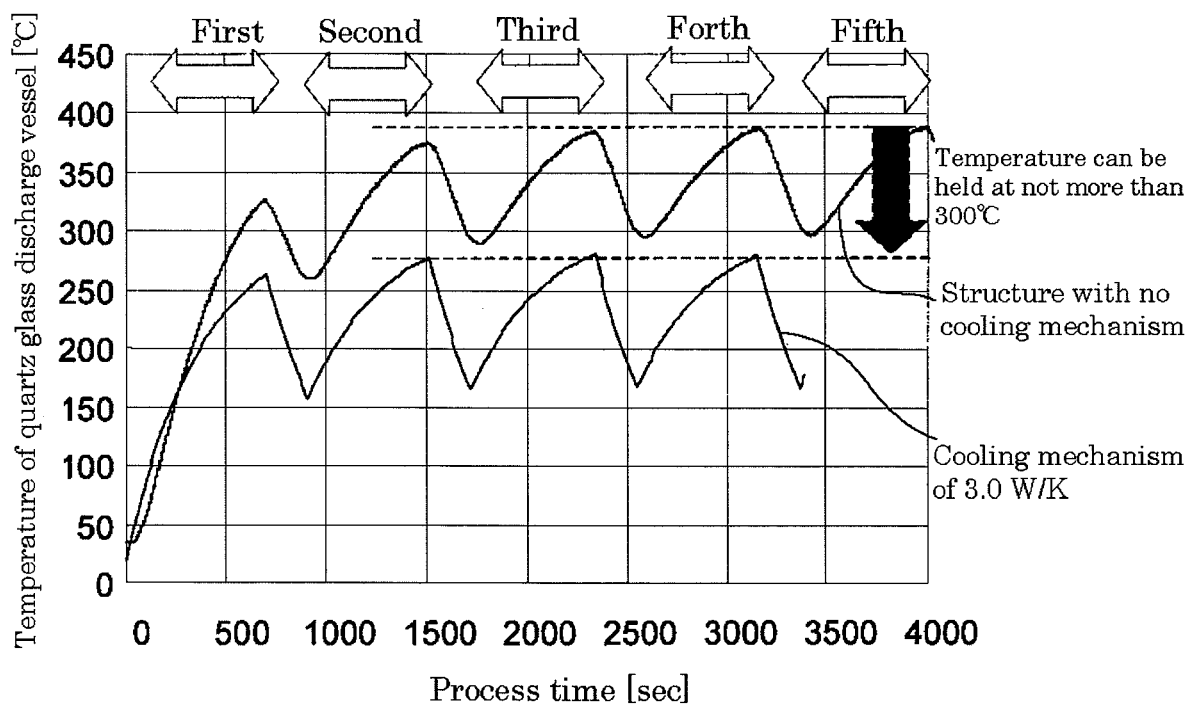

[Fig. 11]
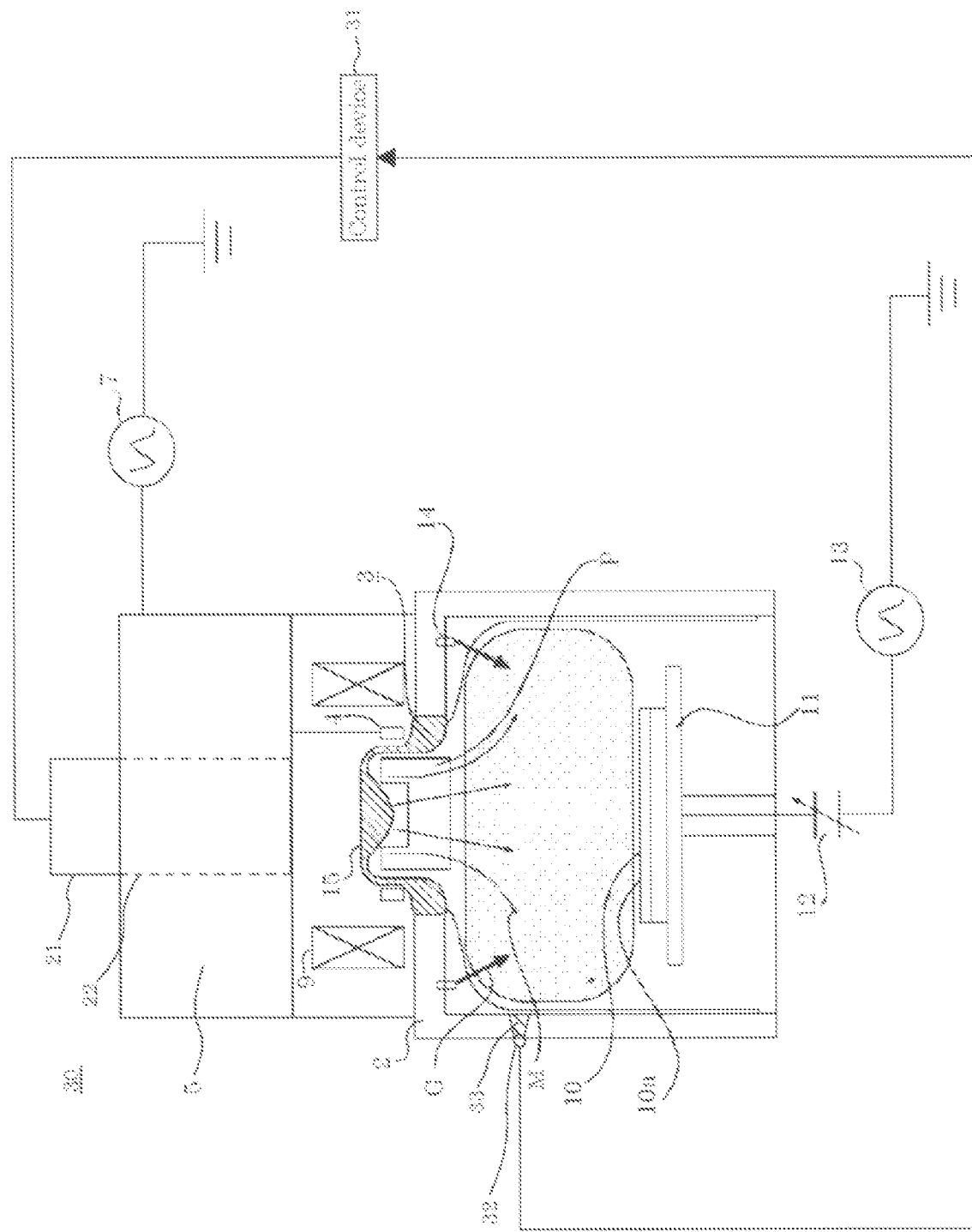

[Fig. 12]
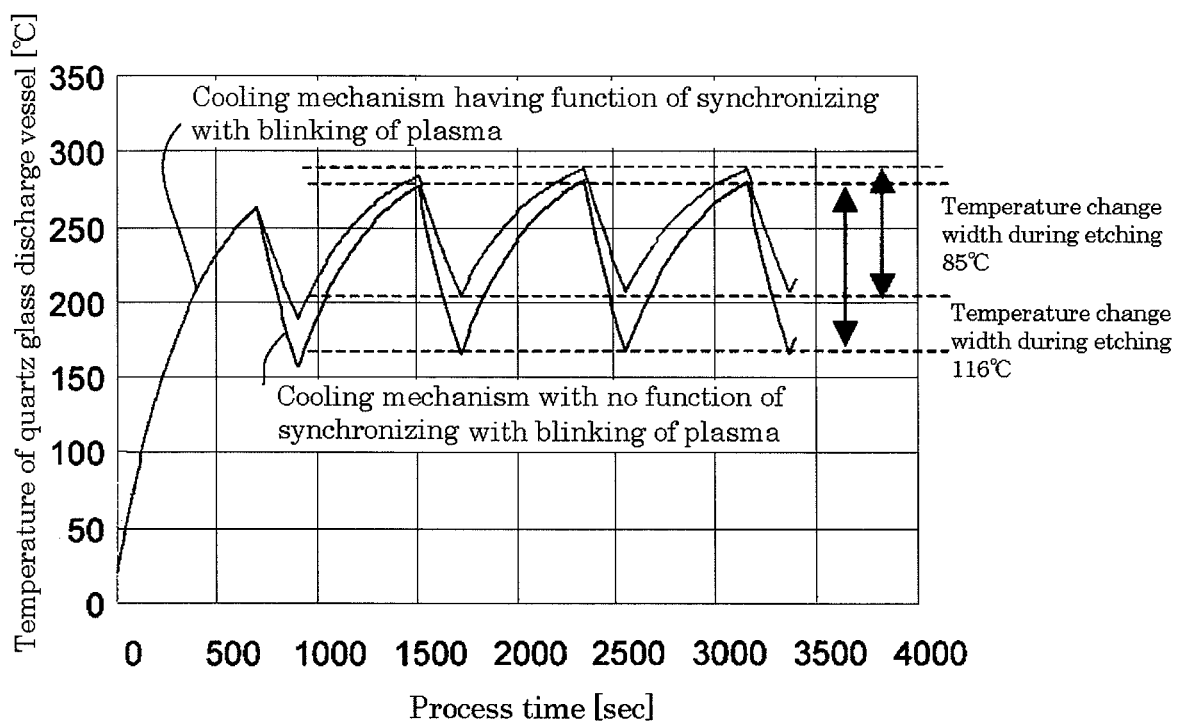

PLASMA PROCESSING APPARATUS AND DEVICE MANUFACTURING METHOD

TECHNICAL FIELD

The present invention relates to a plasma processing apparatus and a device manufacturing method, and relates particularly to a plasma processing apparatus, which is suitable for producing a fine structure constituting a device such as various electronic components, a semiconductor integrated circuit element, various sensors, and various micromachine elements, and a device manufacturing method.

BACKGROUND ART

As an example of the plasma processing apparatus, there is an inductively coupled type dry etching apparatus with magnetic field. For this type of etching apparatus, an inductively-coupled plasma is generated in a discharge vessel, and a surface of a substrate disposed in a processing chamber is dry etched using the plasma (for example, see, Patent Document 1).

The discharge vessel is formed of a dielectric. A coiled antenna is wound around thereto and generates an induced electric field in the discharge vessel under reduced pressure. The antenna receives power supplied from a high-frequency power source. Also, a ring-shaped electromagnet is arranged around the outer periphery of the antenna concentrically with respect to the discharge vessel. The plasma generated in the discharge vessel is diffused in the processing chamber by a divergent magnetic field generated from the electromagnet.

The inductively coupled type dry etching apparatus with magnetic field provided with the above electromagnet can efficiently diffuse plasma in the processing chamber, has high energy efficiency, and can obtain very useful processing characteristics.

PRIOR ART DOCUMENTS

Patent Documents

Patent Document 1: Japanese Patent Application Laid-Open No. 2000-133498

DISCLOSURE OF THE INVENTION

Problems to be Solved by the Invention

However, in the dry etching apparatus having the above constitution, the discharge vessel has a closed end portion at the opposite side of the processing chamber, and there is a problem that the damage from plasma is applied to the closed end portion. Especially, magnetic lines of the divergent magnetic field generated by an electromagnet are focused on the center axis portion of the discharge vessel, and damage is easy to occur locally. This causes material alteration and a problem that a hole is formed in extreme cases, and air is mixed through the hole. The damage in this case means the incident damage of high-energy charged particles from plasma, heating caused by the incidence of the high-energy charged particles, the heat damage caused by the heating, and so on.

As the dielectric constituting the discharge vessel, quartz glass which has small high-frequency loss and is excellent in processing characteristics is used. However, at the close end portion of the discharge vessel, crystallization of glass (often called devitrification) easily occurs, and a hole is easily formed. Thus, there is a problem that the replacement cycle of an expensive discharge vessel is shortened.

Accordingly, in order to stably operate a dry etching apparatus, improvement of the above damaged portion is an essential task.

In view of the above circumstances, the invention provides a plasma processing apparatus which can reduce the damage from plasma generated in a discharge vessel and can lengthen the replacement cycle of the discharge vessel, and a method of manufacturing a device using the plasma processing apparatus.

Means for Solving the Problems

In order to solve the above problem, it can be considered that the discharge vessel is separated by not less than a predetermined distance from the center in the axial direction of an electromagnet. However, in this case, since the necessary magnetic field strength cannot be secured, especially in a region separated from the central axis of the electromagnet in a radial direction, plasma cannot be satisfactorily diffused. Also, according to circumstances, etching of an inner wall of the discharge vessel is promoted by undiffused charged particles. Meanwhile, according to the invention, a protrusion is provided, and the inner wall of the discharge vessel is shifted from a focus position of the charged particles by plasma, whereby the durability of the discharge vessel can be enhanced without reducing diffuser efficiency.

The constitution of the invention made to achieve the above object is as follows.

Namely, a plasma processing apparatus according to the invention is the plasma processing apparatus comprising a processing chamber partitioning a processing space, a discharge vessel constituted of a tubular body whose one end opens facing inside the processing chamber and the other end is closed, an antenna which is disposed around the discharge vessel and generates an induced electric field to generate plasma in the discharge vessel under reduced pressure, and a magnet which is arranged around the discharge vessel and forms a divergent magnetic field in the discharge vessel. The plasma processing apparatus is further characterized in that a closed end portion of the discharge vessel has a protrusion projecting toward the processing chamber.

The plasma processing apparatus according to the invention is characterized by comprising a processing chamber partitioning a processing space, a discharge vessel constituted of a tubular body whose one end opens facing inside the processing chamber and the other end is closed, an antenna which is disposed around the discharge vessel and generates an induced electric field to generate plasma in the discharge vessel under reduced pressure, a magnet having a coil arranged around the discharge vessel, and a member which is provided in the discharge vessel, disposed at at least the center in the axial direction of the magnet, and blocks diffusion of plasma from the center in the axial direction of the magnet to the opposite side of the processing chamber.

In a device manufacturing method according to the invention, plasma is generated in a discharge vessel and diffused in a processing chamber by a divergent magnetic field of a magnet to process an object to be processed, whereby a device is manufactured. This method is characterized in that, in a plasma processing, the discharge vessel comprising at its closed end portion a protrusion projecting toward the processing chamber is arranged.

Effect of the Invention

According to the invention, since a closed end portion of a discharge vessel has a protrusion projecting toward a processing chamber, the damage from plasma in the discharge vessel can be reduced, and the replacement cycle of the discharge vessel can be lengthened.

BRIEF DESCRIPTION OF THE DRAWINGS

FIG. 1 A view showing a schematic constitution of a dry etching apparatus of a first embodiment.

FIG. 2 A cross-sectional view showing a structure of a discharge vessel.

FIG. 3 A schematic partial cross-sectional view for explaining a constitution of an electromagnet.

FIG. 4 A view showing a positional relationship between the electromagnet and a protrusion.

FIG. 5 A partially exploded cross-sectional view of the discharge vessel.

FIG. 6 A view showing the positional relationship between the electromagnet and the protrusion.

FIG. 7 A schematic diagram showing a dry etching apparatus of a second embodiment.

FIG. 8 An explanatory view showing a relationship between a temperature of the protrusion and an amount of etching residue.

FIG. 9 An explanatory view showing a temperature transition of the discharge vessel when a dry etching processing is performed with each cooling efficiency, using the dry etching apparatus of the second embodiment.

FIG. 10 An explanatory view showing the temperature transition of the discharge vessel when a dry etching process is repeatedly performed.

FIG. 11 A schematic diagram showing a dry etching apparatus of a third embodiment.

FIG. 12 An explanatory view showing the temperature transition of the discharge vessel between when cooling is performed only during discharge according to each substrate processing and when cooling is continued not only during discharge but also during no discharge period.

MODES FOR CARRYING OUT THE INVENTION

Hereinafter, embodiments of the invention will be described with reference to drawings. However, the invention is not limited to the embodiments.

First Embodiment

In the present embodiment, as a plasma processing apparatus, a high-frequency inductively coupled type dry etching apparatus with magnetic field is exemplified.

FIG. 1 is a schematic view schematically showing a dry etching apparatus of the present embodiment.

As shown in FIG. 1, a dry etching apparatus 1 of the present embodiment is provided with a processing chamber 2 partitioning a processing space, and a discharge vessel 3 is arranged at the central portion of the upper wall of the processing chamber 2.

The discharge vessel 3 is a vessel whose one end opens and the other end is closed. The discharge vessel 3 is arranged so that the open end portion is the lower end, the closed end portion is the upper end and the open end portion faces the inside of the processing chamber 2. Namely, the inside of the discharge vessel 3 and the inside of the processing chamber 2 are communicated with each other. Although not illustrated, the processing chamber 2 is connected to an exhaust system, so that processing can be performed while exhausting is performed.

A detailed configuration of the discharge vessel 3 in the present embodiment will be described with reference to FIGS. 2 and 5. FIG. 2 is a cross-sectional view of the discharge vessel 3 of the present embodiment. FIG. 5 is a partially exploded cross-sectional view of the discharge vessel 3 for explanation of the structure and the production process.

The discharge vessel 3 of the present embodiment is a cylindrical tubular body, and the closed end portion has a protrusion 15 projecting toward the processing chamber 2 (the protrusion 15 is a member provided in the discharge vessel 3, arranged at at least the center in the axial direction of a magnet 9, and blocks diffusion of plasma from the center in the axial direction of the magnet 9 to the opposite side of the processing chamber 2). In this embodiment, the thickness of the closed end portion of the discharge vessel 3 is increased so that the protrusion 15 is formed as a curved surface projecting the most at an intersection C with a center axis A1 of the discharge vessel 3. As a material of the protrusion 15, a dielectric such as quartz glass, ceramics, and sapphire may be used. Particularly when quartz glass is used, it is preferable in that a high-frequency loss is small, and processing characteristics are excellent. The discharge vessel 3 has a flange 16 formed at the open end portion, and the discharge vessel 3 can be attached to the processing chamber 2 by the flange 16. For example, the flange 16, a tubular main body 17, and the protrusion 15 are formed, respectively, to be thereafter bonded, whereby the discharge vessel 3 is integrally molded.

In the present embodiment, the closed end portion of the discharge vessel 3 serves as the protrusion 15, and therefore, although the protrusion 15 and the discharge vessel 3 are formed of the same material, they may be formed of dielectrics of different materials. The protrusion 15 may not be a curved surface, and may project conically or in a stepwise manner.

A coiled antenna 4 is disposed around the discharge vessel 3. The antenna 4 is, for example, connected to a power source 7 such as a high-frequency power source through a matching circuit 6. The antenna 4 generates an induced electric field in the discharge vessel 3 by the power supply from the power source 7, and a gas for discharge is introduced into the processing chamber 2 and the discharge vessel 3 under reduced pressure, whereby the antenna 4 generates plasma in the discharge vessel 3. In the present embodiment, one end of the power source 7 is connected to the antenna 4, and the other end is grounded. When a high-frequency power source is used, high frequency of 13.56 MHz or 27.12 MHz is used, for example.

The ring-shaped or spiral electromagnet 9 as magnetic field setting means is provided at the outer periphery of the antenna 4, and a center axis A2 of the electromagnet 9 is arranged coaxially with the center axis A1 of the discharge vessel 3. The electromagnet 9 forms an alternating magnetic field along the axial direction and diffuses plasma P, generated in the discharge vessel 3, in the processing chamber 2 by a divergent magnetic field M diverging toward the processing chamber 2. In the present embodiment, although a single electromagnet is used, two or more electromagnets may be arranged concentrically, for example. In this case, at least one of the electromagnets may satisfy the relation of the present invention. For example, when the electromagnets are different in strength, it is preferable that the electromagnet forming a stronger magnetic field satisfies the relation of the present invention.

The processing chamber 2 includes at its lower portion a substrate holder 11 holding a substrate 10 as an object to be processed. The substrate holder 11 can hold a processed surface 10a of the substrate 10 toward the discharge vessel 3. The substrate holder 11 is connected to a bias power source 13 through a matching circuit 12, and the incident ion energy on the substrate 10 can be controlled by controlling voltage applied to the substrate 10.

The processing chamber 2 is provided with a gas introduction port 14 communicating with gas introduction means (not shown). A process gas used for etching and a gas for discharge required for plasma generation can be introduced into the processing chamber 2 through the gas introduction port 14.

The kinds of the gas for discharge and the process gas are not limited especially. As the gas for discharge, for example, an inert gas such as Ar, Kr, and $N_2$ may be used. As the process gas, for example, one or a combination of halogen or a halide gas such as $Cl_2$, BCl, and $CHF_3$, a sulfide gas such as $SO_2$, and $N_2$ and $O_2$ may be used according to the kind of an object to be subjected to etching processing. Depending on the kind of the process gas, the gas for discharge is not used, but the process gas may be used for discharge and etching. Particularly in a mixed gas containing $SO_2$ and $O_2$, an etching residue is easily generated under high temperature conditions of more than 300° C. Accordingly, the mixed gas is preferably used when dry etching processing is performed while the discharge vessel 3 is cooled to not more than 300° C. by a cooling mechanism 21 as in second and third embodiments to be described later (see, FIGS. 7 and 11 to be described layer).

Next, a positional relationship between the protrusion 15 of the discharge vessel 3, which is a feature of the invention, and the electromagnet 9 will be described.

As shown in FIG. 4, when a distance L is a distance between a center point D which is the centers in the axial direction and the radial direction of the electromagnet 9 and a protruding end of the protrusion 15 (an intersection C in the present embodiment), it is preferable that the protruding amount of the protrusion 15 and the arrangement of the electromagnet 9 are set so that the distance L is not less than 20 mm. As shown in FIG. 4, in the plasma generation, charged particles move so as to wind around magnetic lines of the divergent magnetic field M (shown by E in FIG. 4), and therefore, the charged particles are likely to be focused near the center point D of the electromagnet 9 on which the magnetic lines are focused. By virtue of the protrusion 15, the inner wall of the discharge vessel 3 is provided so as to be shifted from the focus position to be easily etched, whereby it is possible to prevent etching of the inner wall of the discharge vessel 3.

Even if the protrusion 15 is provided, when the distance L is less than 20 mm, etching may not be fully avoided. Meanwhile, when the discharge vessel 3 and the electromagnet 9 are excessively separated, and the distance L is increased too much, the satisfactory divergent magnetic field M cannot be secured in the discharge vessel 3, particularly at an outside portion in the radial direction, and thus the diffuser efficiency may be reduced. Likewise, when the protruding amount of the protrusion 15 is large, the size of the magnetic field is significantly changed in the radial direction, and the diffuser efficiency may be reduced. Accordingly, the distance L is preferably not more than 60 mm.

Although the axial direction distance between a closed end surface of the inner wall of the discharge vessel 3 and the center in the axial direction of the electromagnet 9 is not limited especially, it is preferable that the closed end surface is near the center in the axial direction of the electromagnet 9. Considering that satisfactory magnetic field strength is obtained on the outside in the radial direction in the discharge vessel 3, it is preferable that the axial direction distance is within a range of approximately 0 mm to 10 mm. With regard to the protruding amount of the protrusion, considering the durability of the discharge vessel and the capacity of the discharge vessel, it is preferable that a distance from a bottom portion of a discharge vessel to the tip of the protrusion is 27 mm to 47 mm. When the protruding amount is too small, there are drawbacks in the durability, and when the protruding amount is too large, the capacity of the discharge vessel is reduced, so that plasma is hardly generated.

In the example of FIG. 4, although the closed end surface of the inner wall of the discharge vessel 3 and the protrusion 15 are arranged toward the processing chamber 2 relative to the center in the axial direction of the electromagnet 9, the invention is not limited thereto. For example, as shown in FIG. 6, the protruding amount of the protrusion 15 is increased in such a state that the closed end surface is arranged on the atmosphere side relative to the center in the axial direction of the electromagnet 9, whereby the distance L may be not less than 20 mm.

Also when the electromagnet 9 and the discharge vessel 3 are not arranged concentrically, the protrusion 15 projects toward the processing chamber 2 along the center axis A2 of the electromagnet 9, and the distance between the center in the axial direction of the electromagnet 9 and the intersection of the protrusion 15 with the center axis A2 of the electromagnet 9 may be not less than 20 mm. The protrusion 15 may not project the most at the intersection with the center axis A2 of the electromagnet 9, and the protrusion 15 may project the most at other portion. The protrusion 15 has any desired shape.

Next, the operational effects of the dry etching apparatus 1 and a device manufacturing method using the dry etching apparatus 1 will be described.

The processed surface 10a of the substrate 10 is dry etched using the dry etching apparatus 1 of FIG. 1. In the present embodiment, for example, a resist film formed on the processed surface 10a of the substrate 10 and composed mainly of an organic matter is an object to be processed.

First, in the plasma processing in the processing chamber 2, the discharge vessel 3 having at its closed end portion the protrusion 15 projecting toward the processing chamber 2 is arranged.

In the dry etching, the processing chamber 2 is depressurized, and, at the same time, the gas for discharge is introduced. Then, power is supplied to the antenna 4, whereby plasma is generated in the discharge vessel 3 under reduced pressure. The divergent magnetic field is formed by the electromagnet 9 to diffuse the plasma into the processing chamber 2, and, thus, to react the plasma with the process gas introduced in the processing chamber 2. The direction G in FIG. 1 is the direction of the flow of the process gas.

The process gas produces chemical reaction by the plasma P in the processing chamber 2 to etch the processed surface 10a of the substrate 10. At that time, if necessary, power from the bias power source 13 is supplied to an electrode in the substrate holder 11 to adjust the incident ion energy on the substrate 10.

For example, in the etching of $SiO_2$ film produced on the processed surface 10a of the substrate 10, when plasma is generated using a $CF_4$ gas as the process gas, fluorine active species are generated to be reacted with $SiO_2$. The generated reaction product (such as $SiF_4$ and $O_2$) is exhausted or removed as a gas, whereby the etching is achieved. In the actual fine processing, a predetermined fine pattern is previously formed as a mask on a surface of a film to be etched by light exposure and development technology, and a target material film is etched using the mask pattern, whereby the fine processing is achieved.

According to the dry etching apparatus 1 of the present embodiment, by virtue of the protrusion 15, the inner wall of the discharge vessel 3 is arranged to avoid the portion on which the magnetic lines are focused by the ring-shaped electromagnet 9, and therefore, the damage to the discharge vessel 3 is reduced, and high durability is realized.

In order to confirm the operational effects of the invention, an endurance test is performed using the dry etching apparatus 1 of FIG. 1. Specifically, the discharge vessel 3 is constituted of quartz glass, and the thickness of the protrusion 15 is set to various values. A predetermined dry etching process is repeated in the respective cases where the protrusion 15 is formed and not formed, and the durability is confirmed.

As a result, when the protrusion 15 is formed, the effect of the improvement of the durability is confirmed in each case, in comparison with the case where the protrusion 15 is not formed.

As described above, when the dry etching apparatus 1 of the present embodiment is used, the replacement cycle of the discharge vessel 3 can be significantly improved, so that it is very useful in the device manufacturing field.

Second Embodiment

Next, a plasma processing apparatus of a second embodiment according to the invention will be described with reference to FIGS. 7 to 10. In the second embodiment, as in the first embodiment, a high-frequency inductively coupled type dry etching apparatus with magnetic field is exemplified as the plasma processing apparatus. FIG. 7 is a schematic diagram showing the plasma processing apparatus of the second embodiment.

As shown in FIG. 7, a dry etching apparatus 20 of the second embodiment is provided with a matching box 5 and a cooling mechanism 21, and this point is different from the dry etching apparatus 1 of the first embodiment. The same components as those of the first embodiment are denoted by the same reference numerals.

The cooling mechanism 21 is a device locally cooling the protrusion 15 to not less than 10° C. and not more than 300° C. The cooling mechanism 21 of the present embodiment is constituted of, for example, an air-blowing fan supplying air as a cooling medium from the outside of the discharge vessel 3 to the closed end portion of the discharge vessel 3. The cooling efficiency is set to a predetermined value by adjusting the air-blowing amount of the fan. In the present embodiment, the cooling efficiency is set to not less than 3.0 W/K and not more than 100 W/K, whereby the protrusion 15 is cooled to not less than 10° C. and not more than 300° C. Although the cooling mechanism 21 is disposed on the matching box 5, an opening 22 is formed directly below an air-blowing opening of the cooling mechanism 21, whereby air can be directly supplied into the discharge vessel 3. The cooling mechanism 21 is not limited to the air-blowing fan.

As described above, the protrusion 15 is cooled to not less than 10° C. and not more than 300° C., whereby the generation of the etching residue can be suppressed. Hereinafter, a generation mechanism of the etching residue will be described. When the protrusion 15 is heated by a heat input from the plasma P, a material of a dielectric, such as quartz glass and ceramics, or accumulated deposition is sputtered to be scattered on the processed surface 10a to be etched of the substrate 10. When the etching rate of the scattered material is slower than that of the object to be etched, that is, when the selection ratio with the object to be etched is large, the scattered material becomes a micro mask. The etching residue is caused by the micro mask.

FIG. 8 is an explanatory view showing a relationship between a temperature of the protrusion and the amount of the etching residue. As shown in FIG. 8, if the temperature of the protrusion is more than 300° C. ($T_0$), the etching residue is generated, and the amount is increased rapidly in accordance with the increase in the temperature. For this reason, the temperature of the protrusion is cooled to not more than 300° C., whereby the generation of the etching residue can be suppressed. When the temperature of the protrusion 15 is less than 10° C., there occur problems such as dew condensation, and therefore, it is preferable that the protrusion 15 is cooled to not less than 10° C.

FIG. 9 is an explanatory view showing a temperature transition of the discharge vessel when the dry etching processing is performed with each cooling efficiency, using the dry etching apparatus of the second embodiment. The temperature of the discharge vessel 3 is obtained by measuring the temperature of the protrusion 15 with a non-contact thermometer.

As a result, when the cooling efficiency is not less than 3 W/K, it is confirmed that the temperature of the protrusion 15 is held at not more than 300° C. in a discharge period of 600 sec that is the maximum processing time of a single normal dry etching process, and the equilibrium temperature is held near 300° C.

FIG. 10 is an explanatory view showing the temperature transition of the discharge vessel when the dry etching process is repeatedly performed. As shown in FIG. 10, the protrusion 15 having a structure not including the cooling mechanism 21 is overheated to more than 300° C. However, when the protrusion 15 is cooled by the cooling mechanism 21 (the cooling efficiency is 3 K/W), the temperature of the protrusion 15 can be maintained at not more than 300° C. According to the second embodiment, in addition to the operational effects similar to those in the first embodiment, there is provided such an advantageous effect that the temperature increase of the protrusion 15 and the temperature change during etching are suppressed by the cooling by the cooling mechanism 21, whereby the generation of the etching residue can be suppressed.

If the cooling efficiency is too high, the accumulation of deposition in the discharge vessel 3 is facilitated, and this causes generation of particles, or the maintenance cycle is shortened. Therefore, it is preferable that the cooling efficiency is not more than 100 W/K at most.

Third Embodiment

Next, a plasma processing apparatus of a third embodiment according to the invention will be described with reference to FIGS. 11 and 12. In the third embodiment, as in the first and second embodiments, a high-frequency inductively coupled type dry etching apparatus with magnetic field is exemplified as the plasma processing apparatus. FIG. 11 is a schematic diagram showing the dry etching apparatus of the third embodiment.

As shown in FIG. 11, a dry etching apparatus 30 of the third embodiment is provided with a control device 31 of the cooling mechanism 21, and this point is different from the dry etching apparatus 20 of the second embodiment. The same components as those of the first and second embodiments are denoted by the same reference numerals.

The control device 31 has a function of operating the cooling mechanism 21 in synchronism with blinking of plasma discharge. Specifically, a discharge sensor 32 for detecting light emission in the plasma excitation is provided in the processing chamber 2. The control device 31 operates the cooling mechanism 21 while the discharge sensor 32 detects discharge. When discharge is not performed, the control device 31 performs control to stop the operation of the cooling mechanism 21. The discharge sensor 32 is formed of a light receiving element. As shown in FIG. 11, the discharge sensor 32 is disposed outside a window portion 33, formed in a side wall of the processing chamber 2, so as to face inside the processing chamber 2. Namely, the discharge sensor 32 determines the presence of discharge based on the light-receiving amount detected through the window portion 33.

The cooling may not be performed intermittently based on the detection of the discharge sensor, and, for example, the control device 31 may intermittently operate the cooling mechanism 21 according to on/off of the power supply from the power source 7 to the antenna 4 executed with a predetermined sequence in accordance with a process procedure. Alternatively, the control device 31 may intermittently operate the cooling mechanism 21 by providing a discharge detection circuit on a transmission path connecting the power source 7 and the antenna 4 to actually detect the start and end of discharge, and synchronizing with the detection. The cooling mechanism 21 may not be intermittently operated, and, for example, the control device 31 changes the cooling efficiency in a stepwise manner or continuously between when discharge is not performed and when discharge is performed, whereby the discharge vessel 3 may be intermittently cooled.

During the etching processing, the temperature of the protrusion 15 is increased by the heat input from the plasma P. While the etching processing is not performed, the temperature is reduced mainly by a difference from the atmospheric temperature of the atmosphere side surface of the protrusion 15. The temperature change of the protrusion 15 causes a change of film stress of the accumulated deposition to lead to film delamination, and the accumulated deposition is scattered as particles on a processed surface 10a of the substrate 10, which is an object to be processed. The particles also become the micro mask to be causative of the etching residue. Accordingly, as described above, by virtue of the provision of the control device 31 which performs cooling in synchronism with discharge, the temperature change before and after the etching processing can be suppressed, and the generation of the particles and the generation of the etching residue can be suppressed.

FIG. 12 is an explanatory view showing the temperature transition of the discharge vessel between when cooling is performed only during discharge according to each substrate processing and when cooling is continued not only during the discharge period but also during no discharge period. As shown in FIG. 12, when there is no synchronization function, the temperature change of the protrusion 15 during etching is approximately 116° C. Meanwhile, when cooling is performed in synchronism with discharge by the control device 31, the temperature change of the protrusion 15 can be reduced to 85° C., and the generation of the etching residue accompanying the temperature change can be suppressed.

The increased temperature of the protrusion 15 is different depending on a high frequency power generating the plasma P, the etching time, and the continuation of the etching processing. In this case, the cooling efficiency of the cooling mechanism 21 is changed according to the temperature of the protrusion 15, whereby the temperature can be controlled to the temperature at which no residue is generated.

The third embodiment basically provides operational effects similar to those in the second embodiment. However, according to the third embodiment, by virtue of the use of the cooling method of the protrusion 15, there is provided such an advantageous effect that the generation of the etching residue can be more reliably suppressed.

Hereinbefore, although the preferred embodiments of the invention has been described, these embodiments are examples for the purpose of describing the invention, and it is not intended to limit the scope of the invention to only the above embodiments. The invention can be practiced in various aspects different from the above embodiments without departing from the gist of the invention.

For example, the shape of the protrusion is not limited to the above embodiments. For example, an outer surface of the closed end portion of the discharge vessel may be hollowed by a protrusion to be a concave surface. Namely, in the above embodiments, even if the outer surface of the closed end portion is a protrusion or the periphery, the outer surface of the closed end portion is thick so that both the protrusion and the periphery are the same flat surfaces. However, when a hollow is formed securing a certain degree of thickness, the heat capacity of the protrusion can be suppressed, and, at the same time, the cooling area can be increased when cooling is performed from the outer surface side, and therefore, the cooling effect is high.

The examples to which the invention is applied include not only the etching apparatus but also an ion beam apparatus, which generates plasma in a discharge vessel and draws ion beams toward a processing chamber through a grid, and a CVD apparatus, and the like.

EXAMPLE

Next, an example of the invention will be described.
In the dry etching apparatus 1 shown in FIG. 1, the positional relationship between the electromagnet 9 and the discharge vessel 3 was adjusted, and the distance L was set to various values. A durability test is conducted under the following conditions.
Process gas: $CH_3OH$
Process gas flow rate: 30 sccm
Power supplied to the antenna 4: 3000 W
Bias power: 2000 W
Electromagnetic current: 25 A The $CH_3OH$ gas as the process gas was introduced into the processing chamber 2, and discharge was performed for a total 7 hours. Thereafter, the condition of the inner wall of each of the discharge vessels 3 was compared visually in each case.

As a result, when the distance L was less than 20 mm, the surface of the protrusion 15 was lightly polished, and the polished trace remained. However, in the invention, since the distance L was 20 to 60 mm, the surface of the protrusion 15 was not polished or damaged. If the distance L was more than 60 mm, sufficient diffusion did not occur, thus leading to the reduction of the etching rate.

According to the above results, it was confirmed that the plasma processing apparatus of the invention was excellent in the durability of the discharge vessel.

DESCRIPTION OF THE REFERENCE NUMERALS 1, 20, 30 Dry etching apparatus (plasma processing apparatus)
2 Processing chamber
3 Discharge vessel
4 Antenna
7 Power source
9 Electromagnet
10 Substrate
10a Processed surface
11 Substrate holder
15 Protrusion
16 Flange
17 Main body
21 Cooling mechanism
31 Control device
32 Discharge sensor
P Plasma
M Divergent magnetic field

The invention claimed is:

1. A plasma processing apparatus comprising:
a processing chamber partitioning a processing space;
a discharge vessel comprising a tubular body defined by an outside side wall, one end of the discharge vessel being open to face inside the processing chamber and the other end of the discharge vessel being closed;
an antenna which is disposed around the outside side wall of the discharge vessel and which generates an induced electric field to generate plasma in the discharge vessel under reduced pressure; and
a magnet which is an electromagnet having a coil arranged around an outer periphery of the antenna arranged around the discharge vessel and which forms a divergent magnetic field in the discharge vessel,
wherein a closed end portion of the discharge vessel has a solid protrusion projecting downward from the top of the discharge vessel toward the processing chamber relative to a center in an axial direction of the magnet, an inner surface of a side wall, and a closed end surface,
wherein the protrusion is integral with the outside side wall of the discharge vessel,
wherein an inner surface of the protrusion is formed by only a curved surface,
wherein the closed end surface is arranged on the atmosphere side relative to the center in the axial direction of the magnet,
wherein a boundary between the closed end surface and the inner surface of the protrusion is on a curved surface,
wherein a curved surface is arranged between the closed end surface and the inner surface of the side wall, and
wherein an inner surface of an opening end of the discharge vessel is a curved surface.

2. The plasma processing apparatus according to claim 1, wherein a distance in the axial direction between a protruding end of the protrusion and the center in the axial direction of the magnet is set to not less than 20 mm and not more than 60 mm.

3. The plasma processing apparatus according to claim 1, wherein the protrusion is formed of a dielectric of the same or different material as the discharge vessel and is formed so that the thickness of the closed end portion of the discharge vessel is increased.

4. The plasma processing apparatus according to claim 1, further comprising a cooling mechanism which cools the protrusion.

* * * * *